United States Patent
Hepp (10) Patent No.: US 9,464,951 B2
(45) Date of Patent: Oct. 11, 2016

(54) METHOD AND APPARATUS FOR ELECTRICAL GAP SETTING FOR A PIEZOELECTRIC PRESSURE SENSOR

(71) Applicant: SERCEL INC., Houston, TX (US)

(72) Inventor: John Hepp, Leander, TX (US)

(73) Assignee: SERCEL INC., Houston, TX (US)

( * ) Notice: Subject to any disclaimer, the term of this patent is extended or adjusted under 35 U.S.C. 154(b) by 200 days.

(21) Appl. No.: 14/054,983

(22) Filed: Oct. 16, 2013

(65) Prior Publication Data
US 2015/0101731 A1    Apr. 16, 2015

(51) Int. Cl.
| | |
|---|---|
| B32B 38/00 | (2006.01) |
| G01L 1/16 | (2006.01) |
| G01L 9/00 | (2006.01) |
| H01L 41/113 | (2006.01) |
| H01L 41/25 | (2013.01) |
| H01L 41/313 | (2013.01) |

(52) U.S. Cl.
CPC ............. *G01L 1/16* (2013.01); *B32B 38/0008* (2013.01); *G01L 9/008* (2013.01); *H01L 41/1132* (2013.01); *H01L 41/25* (2013.01); *H01L 41/313* (2013.01)

(58) Field of Classification Search
CPC ..... B32B 38/0008; G01L 1/16; G01L 9/008; H01L 41/1132; H01L 41/25; H01L 41/312; H01L 41/313

USPC .......................... 156/64, 273.3, 273.5, 273.7
See application file for complete search history.

(56) References Cited

U.S. PATENT DOCUMENTS 7,382,689 B2    6/2008 Maples et al.

FOREIGN PATENT DOCUMENTS

JP    2008131059 A  *  6/2008

OTHER PUBLICATIONS

Translation of JP 2008131059 A, published Jun. 2008, Inventor Onozawa, Yasuhide.*
Office Action in corresponding European Application No. 14 150 981.0 dated Oct. 15, 2015.

* cited by examiner

*Primary Examiner* — George Koch
(74) *Attorney, Agent, or Firm* — Patent Portfolio Builders PLLC (57) ABSTRACT

A method for electrically setting a gap for a piezoelectric pressure sensor. The method includes positioning a piezoelectric flex element on a tray; attaching a voltage source to the piezoelectric flex element of a piezoelectric pressure sensor; applying a voltage from the voltage source to the piezoelectric flex element; curing an adhesive between the piezoelectric flex element and the tray while the piezoelectric flex element is deflected by the voltage; and stopping the voltage from the voltage source to the piezoelectric flex element when the adhesive has been cured.

20 Claims, 6 Drawing Sheets

FIG. 11

METHOD AND APPARATUS FOR ELECTRICAL GAP SETTING FOR A PIEZOELECTRIC PRESSURE SENSOR

BACKGROUND

1. Technical Field

Embodiments of the subject matter disclosed herein generally relate to methods and apparatus for using electricity to set a gap in a piezoelectric pressure sensor during fabrication of the piezoelectric pressure sensor.

2. Discussion of the Background

Figure 1:
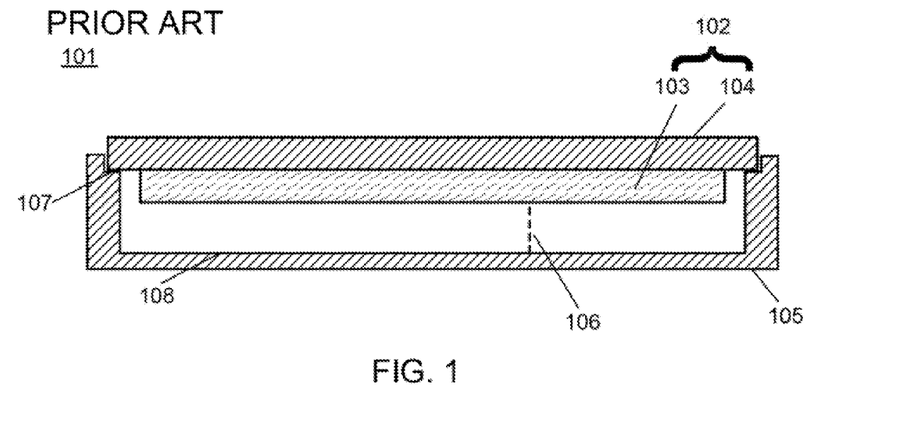
FIG. 1 depicts an exemplary cross-section of a piezoelectric pressure sensor.
Figure 2:
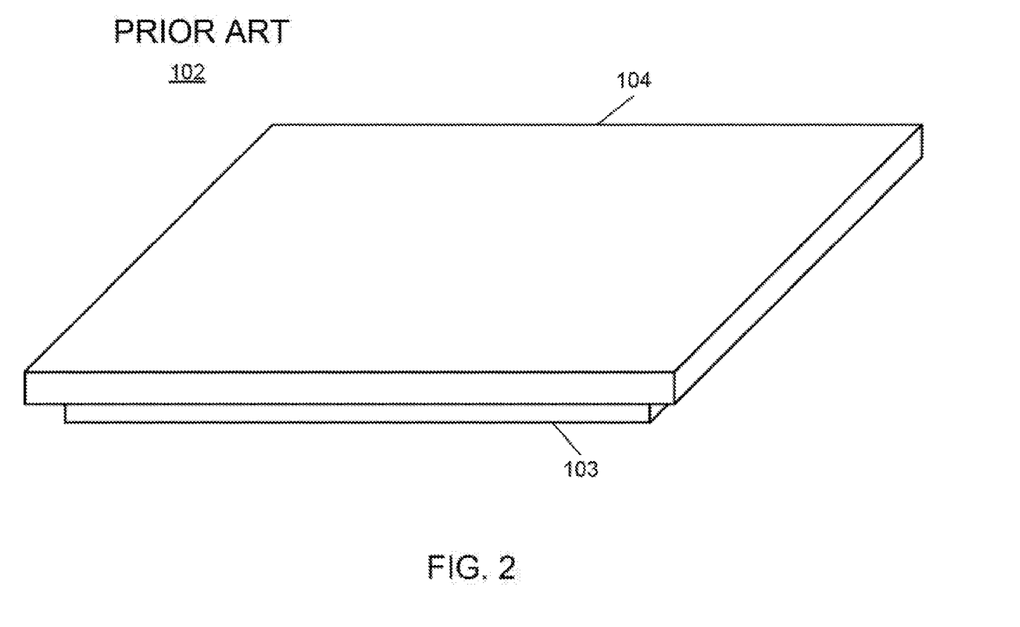
FIG. 2 depicts an exemplary piezoelectric flex element for a piezoelectric pressure sensor.
Figure 3:
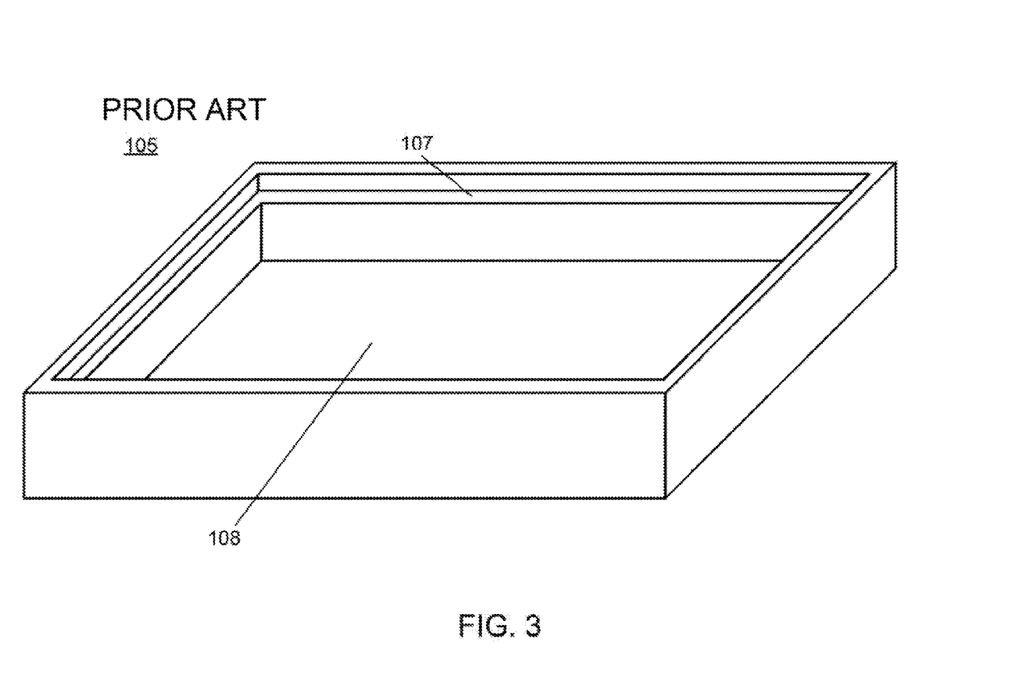
FIG. 3 depicts an exemplary tray for a piezoelectric pressure sensor.

A hydrophone may be a device for listening to and recording sound underwater. For example, a hydrophone may be used for reflective seismology, recording sound bounced off the floor of a body of water in order to determine the structure and composition of the earth under the floor. A hydrophone may use a piezoelectric pressure sensor as a transducer for detecting sound and generating a recordable signal. In U.S. Pat. No. 7,382,689, the entire disclosure of which is incorporated herein by reference, a flexible hydrophone using one or more active elements, or piezoelectric pressure sensors, for detecting seismic signals underwater, is disclosed. FIG. 1 depicts an exemplary cross-section of a piezoelectric pressure sensor. The piezoelectric pressure sensor 101 may be constructed in part by attaching a piezoelectric flex element 102, such as, for example, a piezoceramic unimorph, to the top of a tray 105. FIG. 2 depicts an exemplary piezoelectric flex element for a piezoelectric pressure sensor. The piezoelectric flex element 102 may include a piezoelectric material 103, such as, for example, a piezoceramic, bonded to an inactive substrate 104, which may be metal, glass, plastic or any other suitable material FIG. 3 depicts an exemplary tray for a piezoelectric pressure sensor. The tray 105 may be any suitable shape, including, for example, rectangular, and be made from metal, or any other suitable material. The tray 105 may include a floor 108, and a step 107. The step 107 may encircle the inside of the tray 105, and provide a surface for attaching the piezoelectric flex element 102 to the tray 105.

The piezoelectric flex element 102 may deflect when subjected to pressure, resulting in the piezoelectric material 103 accumulating an electrical charge that can be used to drive current in circuit. The degree to which the piezoelectric flex element 102 can deflect in response to hydrostatic pressure may need to be limited in order to, for example, protect against damage to the piezoelectric flex element 102. This may be accomplished by providing a mechanical limit, such as a rigid surface which may stop the piezoelectric flex element 102 from deflecting any further once the piezoelectric flex element 102 has deflected far enough to contact the rigid surface. The floor 108 of the tray 105 on which the piezoelectric flex element 102 is mounted may serve as the rigid surface. During fabrication of the piezoelectric sensor 101 a gap 106 between the floor 108 and the bottom of the piezoelectric flex element 102 may be established. The size of the gap 106 between the piezoelectric flex element 102 and the floor 108 may be the desired distance the piezoelectric flex element 102 may be allowed to deflect before being mechanically limited. The gap 106 may be large enough to allow the piezoelectric flex element 102 to deflect unrestricted in response to operating pressures within the normal range for the piezoelectric pressure sensor 101.

Setting the gap 106 during the fabrication of the piezoelectric pressure sensor 101 may be difficult, as the gap 106 may be only a few millimeters in size or smaller. If the gap 106 is not maintained properly the piezoelectric flex element 102 may end up too low in the tray 105, leaving no room for the piezoelectric flex element 102 to deflect in response to pressure, or the piezoelectric flex element 102 may break. This may limit the ability of the piezoelectric pressure sensor 101 to detect pressure.

Figure 4:
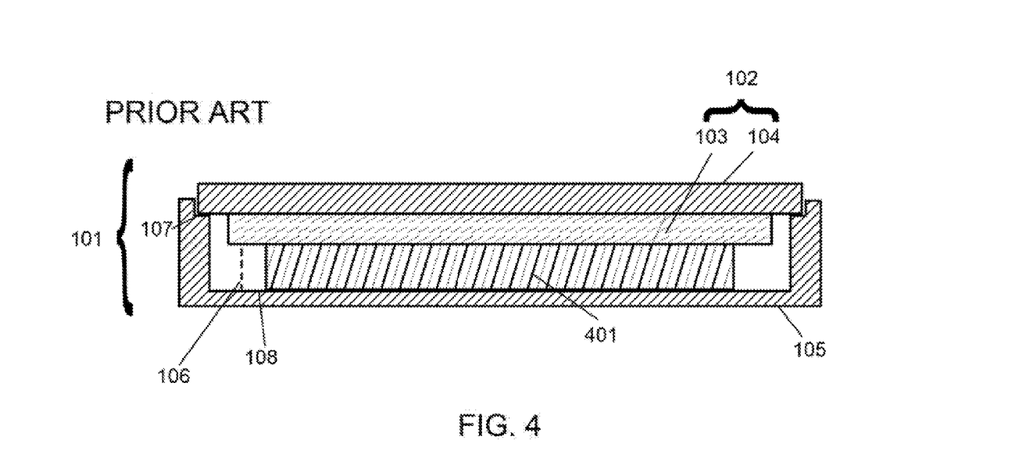
FIG. 4 depicts an exemplary cross-section of a piezoelectric pressure sensor with a mechanically maintained gap in accordance with the prior art.

Current fabrication processes may maintain the gap 106 mechanically during fabrication of the piezoelectric pressure sensor 101. FIG. 4 depicts an exemplary cross section of a piezoelectric pressure sensor with a mechanically maintained gap in accordance with the prior art. As depicted in FIG. 4, not at scale, a shim 401 may be placed on the floor 108 of the tray 105 before the piezoelectric flex element 102 is placed on the tray 105. The shim 401 may be made of any suitable material, such as, for example, plastic. The shim 401 may maintain the gap 106 between the bottom of the piezoelectric flex element 102 and the floor 108 by physically preventing the bottom of the piezoelectric flex element 102 from going any lower than the top of the gap 106 while adhesive between the piezoelectric flex element 102 and the tray 105 is cured. Once the adhesive has cured and the piezoelectric flex element 102 is adhered to the tray 105, locking in the gap 106, the shim 401 may be removed. Inserting and removing the shim 401 may require extra steps during the fabrication process. An access point, such as a hole in the tray 105, may be needed to remove the shim 401, and the access point may need to be sealed up once the shim 401 has been removed. These extra steps may add to the cost and complexity of fabricating the piezoelectric pressure sensor 101.

Thus, there is a need to have a method and apparatus for more efficiently setting a gap during the fabrication of piezoelectric pressure sensors.

SUMMARY

In various embodiments, a method and apparatus are provided for electrical gap setting for a piezoelectric pressure sensor.

In one embodiment, there is a method for electrically setting a gap for a piezoelectric pressure sensor. The method includes positioning a piezoelectric flex element on a tray; attaching a voltage source to the piezoelectric flex element of a piezoelectric pressure sensor; applying a voltage from the voltage source to the piezoelectric flex element; curing an adhesive between the piezoelectric flex element and the tray while the piezoelectric flex element is deflected by the voltage; and stopping the voltage from the voltage source to the piezoelectric flex element when the adhesive has been cured.

According to another embodiment, there is a method for electrically setting a gap for a piezoelectric pressure sensor. The method includes positioning a piezoelectric flex element on a tray; attaching a voltage source to the piezoelectric flex element of a piezoelectric pressure sensor; applying a voltage from the voltage source to the piezoelectric flex element; detecting that the piezoelectric flex element is in contact with a floor of the tray; curing an adhesive between the piezoelectric flex element and the tray while the piezoelectric flex element is deflected by the voltage and the bottom of the piezoelectric flex element is in contact with the floor of the tray; and stopping the voltage from the voltage source to the piezoelectric flex element when the adhesive has been cured.

According to yet another embodiment, there is an apparatus for electrically setting a gap for a piezoelectric pressure sensor. The apparatus includes a voltage source configured to apply a predetermined voltage; a piezoelectric pressure sensor comprising a piezoelectric flex element, a tray, and first and second electrodes attached to the piezoelectric flex element, the piezoelectric flex element configured to deflect downwards towards a floor of the tray when the predetermined voltage is applied, and wherein the piezoelectric flex element is not bonded to the tray; a first electrical lead connected to the voltage source and removably connected to the first electrode; and a second electrical lead connected to the voltage source and removably connected to the second electrode.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. In various embodiments as illustrated in FIGS. 1-11, a gap is electrically set in a piezoelectric pressure sensor.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 5:
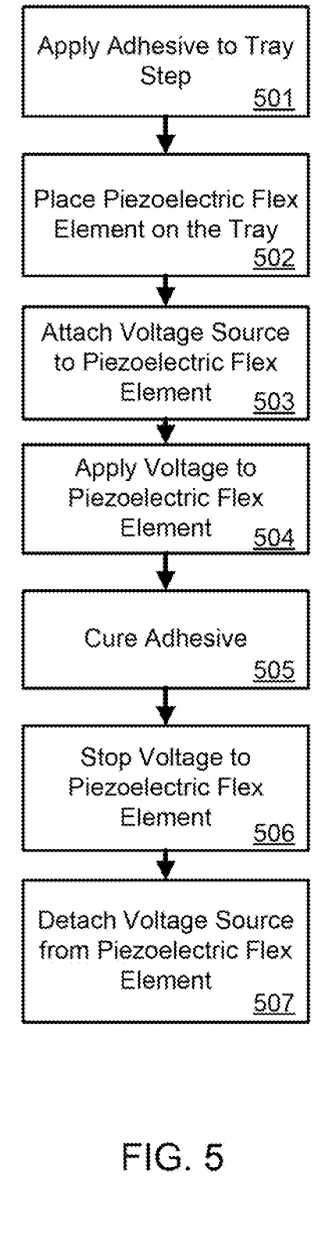
FIG. 5 depicts an exemplary procedure for electrical gap setting for a piezoelectric pressure sensor.

FIG. 5 depicts an exemplary procedure for electrical gap setting for a piezoelectric pressure sensor. In block 501, an adhesive may be applied to the step 107 of the tray 105. The adhesive may be any suitable adhesive for bonding the piezoelectric flex element 102 to the tray 105, and may be selected based on the specific material used in the piezoelectric flex element 102 and the material of the tray 105. For example, ultraviolet cured glue may be used to attach a piezoelectric flex element 102 with a metal inactive substrate 104 to a metal tray 105.

In block 502, the piezoelectric flex element 102 may be placed on the tray 105. The piezoelectric flex element 102, for example, as depicted in FIG. 2, may be placed on the tray 105, for example, as depicted in FIG. 3, such that the edges of the inactive substrate 104 rest on the step 107 where the adhesive was placed in block 501. The piezoelectric pressure sensor 101 may appear as in the cross-section in FIG. 1, but with the piezoelectric flex element 102 not yet bonded to the tray 105.

Figure 6:
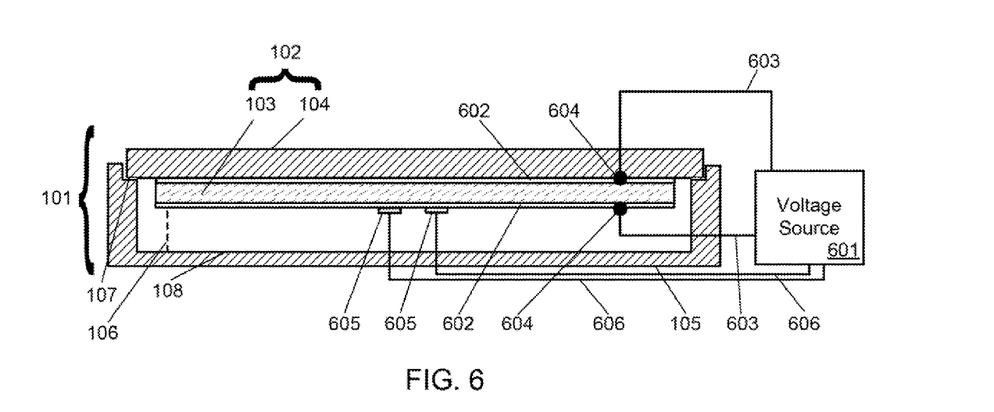
FIG. 6 depicts an exemplary cross-section of a piezoelectric pressure sensor attached to a voltage source.

In block 503, a voltage source 601 may be attached to the piezoelectric flex element 102. The voltage source 601 may be any suitable source of voltage for driving a current, such as, for example, the electricity supply of structure, a battery, an AC generator, or a DC generator, and may include any additional equipment and circuitry for controlling the amount and type of current and voltage being generated. The voltage source 601 may be connected to the piezoelectric flex element 102 at electrodes 602 using electrical leads 603 at contact points 604. FIG. 6 depicts an exemplary cross-section of a piezoelectric pressure sensor attached to a voltage source. The electrodes 602 may be part of the piezoelectric pressure sensor 101, and may be the electrodes used to connect the piezoelectric pressure sensor 101 to a circuit allowing voltage generated by pressure on the piezoelectric flex element 102 to drive a current when the piezoelectric pressure sensor 101 is in operation, for example, in a hydrophone.

In block 504, voltage may be applied to the piezoelectric flex element 102. The voltage source 601 may be used to drive current through the piezoelectric flex element 102. As described previously, subjecting the piezoelectric flex element 102 to pressure that causes the piezoelectric material 103 to deflect may result in the piezoelectric material 103 generating an electrical charge that may allow the piezoelectric material 103 to generate a current which, when measured with a dedicated circuit, provides an indication of the applied pressure. Conversely, driving current through the piezoelectric flex element 102 using an outside source of voltage source, such as the voltage source 601, may cause the piezoelectric material 103 to deflect.

Figure 7:
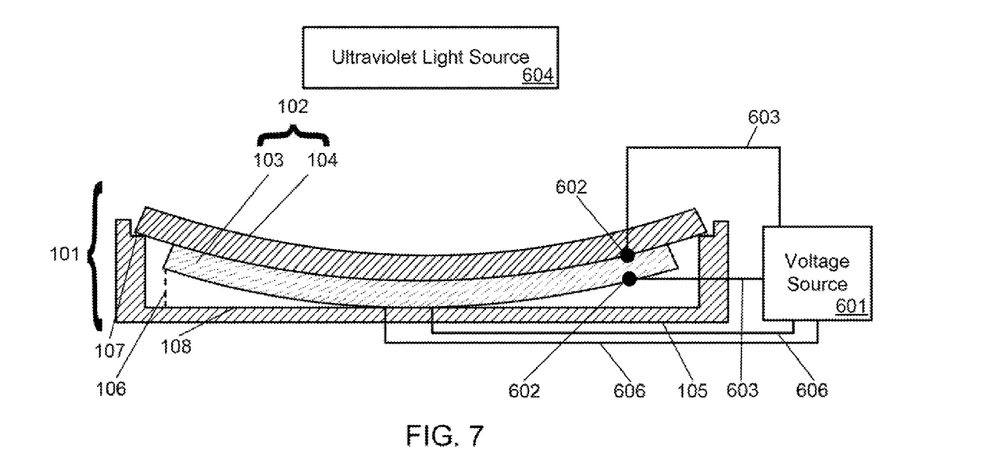
FIG. 7 depicts an exemplary cross-section of a piezoelectric pressure sensor with a deflecting piezoelectric flex element while attached to a voltage source.

FIG. 7 depicts an exemplary cross-section of a piezoelectric pressure sensor with a deflecting piezoelectric flex element while attached to a voltage source. As the voltage source 601 drives a predetermined current which corresponds to the maximum allowed pressure for the piezoelectric pressure sensor 101 through piezoelectric flex element 102, the piezoelectric material 103 may deflect downwards towards the floor 108 of the tray 105. Because the piezoelectric material 103 may be bonded to the inactive substrate 104 to form the piezoelectric flex element 102, deflection by the piezoelectric material 103 may cause deflection by the piezoelectric flex element 102. As depicted in FIG. 7, the piezoelectric flex element 102 may deflect enough that the bottom of the piezoelectric flex element 102 may touch the floor 108 of the tray 105. If being subjected to voltage corresponding to the maximum allowed pressure for the piezoelectric pressure sensor 101 causes the piezoelectric flex element 102 to touch the floor 108 of the tray 105, the procedure may proceed to block 505, where the adhesive may be cured. If the piezoelectric flex element 102 does not touch the floor 108, adjustments may need to be made to the gap 106, as described in FIGS. 9 through 11.

In block 505, the adhesive may be cured. While the piezoelectric flex element 102 is deflected, the adhesive applied in block 501 may be cured, bonding the edges of the piezoelectric flex element 102 to the tray 105. For example, as depicted in FIG. 7, if the adhesive is ultraviolet cured glue, the piezoelectric pressure sensor 101 may be subject to ultraviolet light source 604 to cure the glue while the piezoelectric flex element 102 is deflected. Curing the adhesive while the piezoelectric flex element 102 is deflected may ensure that the piezoelectric flex element 102 does not slip into the tray, for example, with one end of the piezoelectric flex element 102 resting on the step 107 and the other resting on the floor 108. The electrically induced deflection of the piezoelectric flex element 102 may maintain the gap 106 while the adhesive is cured, so that the gap 106 persists when the piezoelectric flex element 102 returns to a non-deflected state after the adhesive has cured.

In block 506, voltage to the piezoelectric flex element 102 may be stopped. The voltage source 601 may be deactivated or disconnected, resulting in a cessation of current through the piezoelectric flex element 102. This may allow the piezoelectric flex element 102 to return to a non-deflected state. The piezoelectric pressure sensor 101 may appear as depicted in cross-section in FIG. 1, with the piezoelectric flex element 102 now bonded to the tray 105 due to the curing of the adhesive in block 505. Curing the adhesive while the piezoelectric flex element 102 was deflected and touching the floor 108 of the tray 105 may result in the piezoelectric flex element 102 being bonded to the tray 105 such that when the piezoelectric flex element 102 is not deflected, the bottom of the piezoelectric flex element 102 is at the top of the gap 106. The piezoelectric flex element 102 may then be able to deflect properly when subject to the range of normal operating pressures, while being stopped by the floor 108 if subjected to pressures that exceed the maximum allowed pressure.

In block 507, the voltage source 601 may be detached from the piezoelectric flex element 102.

When setting the gap 106 by using the voltage source 601 to cause the piezoelectric flex element 102 to deflect, it may be difficult to determine if the piezoelectric flex element 102 is touching the floor 108 of the tray 105. It may be desired to have the piezoelectric flex element 102 deflect as depicted in FIG. 7, with the bottom of the piezoelectric flex element 102 just touching the floor 108 of the tray 105. This may be achieved by, for example, attaching additional electrodes to the bottom of the piezoelectric flex element 102.

For example, as depicted in FIG. 6, contact electrodes 605 may be attached to the bottom of the piezoelectric flex element 102 and connected to the voltage source 601 with electrical leads 606. The contact electrodes 605 may be properly insulated from the bottom electrode 602 to prevent interference with the circuit created by the electrodes 602 and the voltage source 601. The contact electrodes 605 may complete a circuit when the bottom of the piezoelectric flex element 102 contacts the tray 105, providing feedback for determining whether to start curing the adhesive. The voltage source 601 may include any additional equipment and circuitry necessary for determining if the contact electrodes 605 are in contact with the floor 108 of the tray 105.

Figure 8:
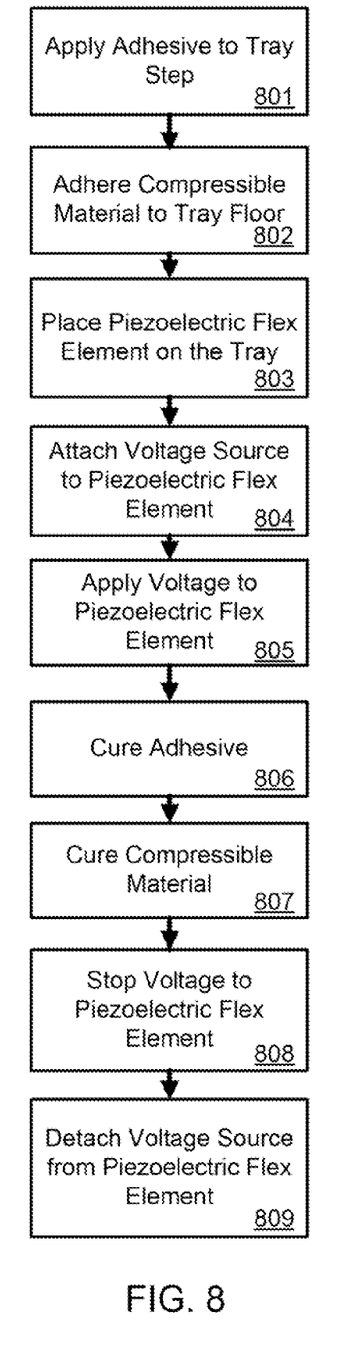
FIG. 8 depicts an exemplary procedure for electrical gap setting for a piezoelectric pressure sensor using a compressible material.

If the contact electrodes 605 do not indicate that the piezoelectric flex element 102 is in contact with the floor 108 when subjected to the maximum predetermined voltage, additional steps may be needed to adjust the gap 106 to provide a limit on the distance the piezoelectric flex element 102 may deflect during operation. For example, the piezoelectric flex element 102 may need to be removed from the tray 105, and a compressible material may be inserted into the tray 105 before the piezoelectric flex element 102 is replaced on to the tray 105. As described in FIG. 8 and depicted in FIGS. 9 through 11, the compressible material may be used on the floor 108 of the tray 105 to create a new bottom for the gap 106. FIG. 8 depicts an exemplary procedure for electrical gap setting for a piezoelectric pressure sensor using a compressible material.

In block 801, adhesive may be applied to the step 107, as described previously in block 501 of FIG. 5.

Figure 9:
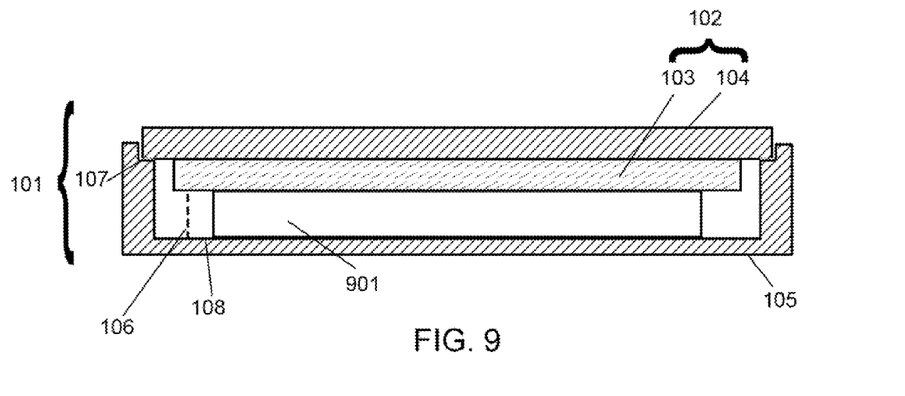
FIG. 9 depicts an exemplary cross-section of a piezoelectric pressure sensor with a compressible material.

In block 802 a compressible material may be adhered to the floor 108 of the tray 105. FIG. 9 depicts an exemplary cross-section of a piezoelectric pressure sensor with a compressible material. The compressible material 901 may be any suitable material that may be compressed and then cured to maintain the compressed state, such as, for example, a thermosetting polymer, and may be adhered to the floor 108 with any suitable adhesive. The compressible material 901 may be any suitable size, and may be placed on the floor 108 in any suitable position, such as, for example, centered in the tray 105.

In block 803, the piezoelectric flex element 102 may be placed on the tray 105, and in block 804, the voltage source 601 may be attached to the piezoelectric flex element 102, as described previously in blocks 502 and 503 of FIG. 5.

Figure 10:
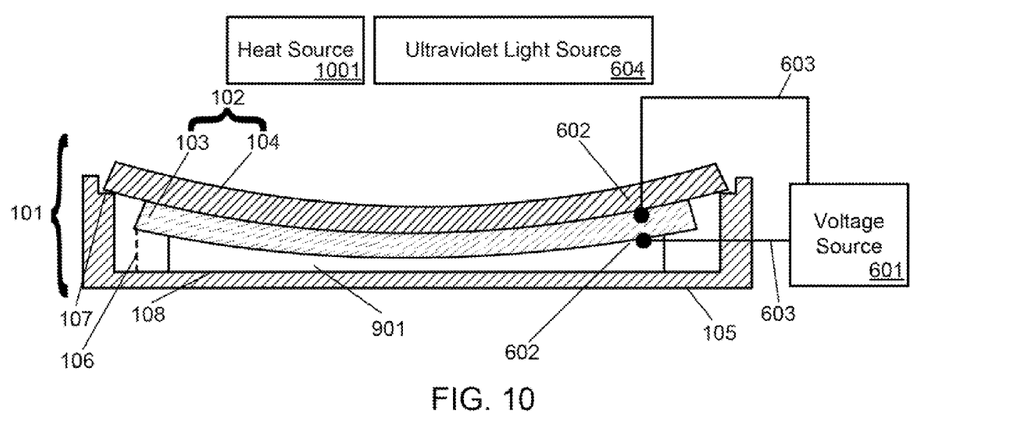
FIG. 10 depicts an exemplary cross-section of a piezoelectric pressure sensor with a piezoelectric flex element deflecting and compressing a compressible material while attached to a voltage source.

In block 805, voltage may be applied to the piezoelectric flex element 102. As described previously, current driven through the piezoelectric flex element 102 may cause the piezoelectric flex element 102 to deflect downwards towards the floor 108 of the tray 105. The compressible material 901 may be in the way of the deflection of piezoelectric flex element 102, resulting in the piezoelectric flex element 102 compressing the compressible material 901. FIG. 10 depicts an exemplary cross-section of a piezoelectric pressure sensor with a piezoelectric flex element deflecting and compressing a compressible material while attached to a voltage source.

In block 806, the adhesive may be cured, as described previously in block 505 of FIG. 5.

In block 807, the compressible material 901 may be cured. Once the compressible material 901 has been compressed by the deflecting piezoelectric flex element 102, the compressible material 901 may need to be cured to prevent the compressible material 901 from returning to its original form, or from being compressed further in the future. The compressible material 901 may be cured in any suitable manner. For example, as depicted in FIG. 10, if the compressible material 901 is a thermosetting polymer, heat may be applied from a heat source 1001 to cure the compressible material 901. Curing the compressible material 901 while compressed may allow the compressible material 901 to act as a rigid surface placing a mechanical limit on the deflection of the piezoelectric flex element 102, setting the gap 106.

Figure 11:
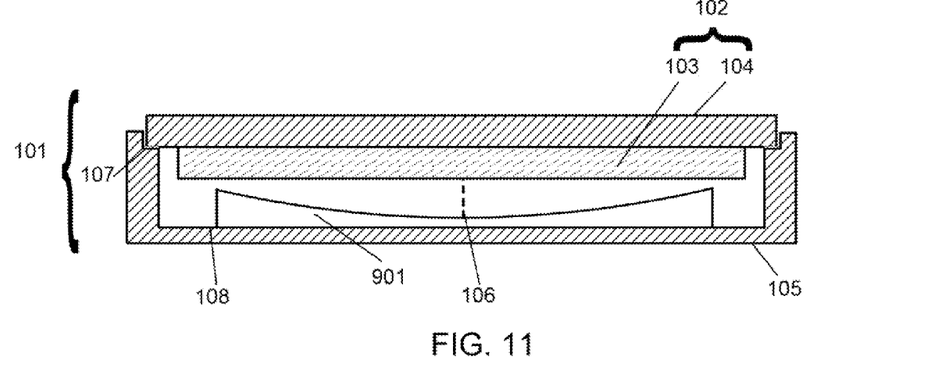
FIG. 11 depicts an exemplary cross-section of a piezoelectric pressure sensor with a compressible material that has been compressed.

In block 808, voltage to the piezoelectric flex element 102 may be stopped. When the piezoelectric flex element 102 returns to a non-deflected state, the compressible material 901 may remain compressed after having been cured in block 802. FIG. 11 depicts an exemplary cross-section of a piezoelectric pressure sensor with a compressible material that has been compressed. The gap 106 may be the distance between the top of the most compressed point of the compressible material 901 and the bottom of the piezoelectric flex element 102. Use of the compressible material 901 may make precise control over the deflection of the piezoelectric flex element 102 during the gap setting procedures described herein unnecessary. The compressible material 901 may be used to form a rigid surface at the bottom of the gap 106, so the size of the gap 106 may be determined by how far the piezoelectric flex element 102 deflects due to current driven by the voltage source 601 rather than by the distance between the bottom of the piezoelectric flex element 102 and the floor 108.

In block 809, the voltage source 601 may be detached from the piezoelectric flex element 102, as described previously in block 507 of FIG. 5.

The disclosed exemplary embodiments provide an apparatus and a method for electrical gap setting for a piezoelectric pressure sensor. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for electrically setting a gap for a piezoelectric pressure sensor comprising:
   positioning a piezoelectric flex element on a tray;
   attaching a voltage source to the piezoelectric flex element of a piezoelectric pressure sensor;
   applying a voltage from the voltage source to the piezoelectric flex element to deflect the piezoelectric flex element toward a bottom of the tray;
   curing an adhesive between opposite ends of the piezoelectric flex element and the tray while the piezoelectric flex element is electrically deflected by the voltage; and
   stopping the voltage from the voltage source to the piezoelectric flex element when the adhesive has been cured.

2. The method of claim 1, wherein the piezoelectric flex element comprises a piezoelectric material bonded to an inactive substrate.

3. The method of claim 2, wherein the piezoelectric material comprises a piezoceramic.

4. The method of claim 1, wherein attaching the voltage source to a piezoelectric flex element comprises:
   attaching the voltage source to a first electrode of the piezoelectric flex element; and
   attaching the voltage source to a second electrode of the piezoelectric flex element.

5. The method of claim 1, further comprising:
   adhering a compressible material to a floor of the tray; and
   after applying the voltage from the voltage source, curing the compressible material while the piezoelectric material is deflected by the voltage to maintain a compressed shape.

6. The method of claim 5, wherein the compressible material comprises a thermosetting polymer.

7. The method of claim 1, wherein the tray comprises a step, and wherein curing an adhesive between the piezoelectric flex element and the tray further comprises bonding the piezoelectric flex element to the step.

8. The method of claim 1, further comprising: adjusting a gap between the piezoelectric flex element and the floor of the tray by adjusting a voltage output of the voltage source.

9. The method of claim 1, further comprising determining that the piezoelectric flex element is in contact with a floor of the tray before curing the adhesive.

10. The method of claim 9, wherein determining that the piezoelectric flex element is in contact with the floor of the tray comprises detecting a circuit formed by first and second contact electrodes attached to the bottom of the piezoelectric flex element.

11. The method of claim 1, wherein the voltage determines a gap between the piezoelectric flex element and the floor of the tray.

12. A method for electrically setting a gap for a piezoelectric pressure sensor comprising:
    positioning a piezoelectric flex element on a tray;
    attaching a voltage source to the piezoelectric flex element of a piezoelectric pressure sensor;
    applying a voltage from the voltage source to the piezoelectric flex element;
    detecting that the piezoelectric flex element is in contact with a floor of the tray;
    curing an adhesive between the piezoelectric flex element and the tray while the piezoelectric flex element is deflected by the voltage and the bottom of the piezoelectric flex element is in contact with the floor of the tray; and
    stopping the voltage from the voltage source to the piezoelectric flex element when the adhesive has been cured.

13. The method of claim 12, wherein the piezoelectric flex element comprises a piezoelectric material bonded to an inactive substrate.

14. The method of claim 13, wherein the piezoelectric material comprises a piezoceramic.

15. The method of claim 12, wherein attaching the voltage source to a piezoelectric flex element comprises:
    attaching the voltage source to a first electrode of the piezoelectric flex element; and
    attaching the voltage source to a second electrode of the piezoelectric flex element.

16. The method of claim 12, further comprising:
    adhering a compressible material to a floor of the tray; and
    after applying the voltage from the voltage source, curing the compressible material while the piezoelectric material is deflected by the voltage to maintain a compressed shape.

17. The method of claim 16, wherein the compressible material comprises a thermosetting polymer.

18. The method of claim 12, wherein the tray comprises a step, and wherein curing an adhesive between the piezoelectric flex element and the tray further comprises bonding the piezoelectric flex element to the step.

19. The method of claim 12, further comprising:
adjusting a gap between the piezoelectric flex element and the floor of the tray by adjusting a voltage output of the voltage source.

20. The method of claim 12, wherein detecting that the piezoelectric flex element is in contact with the floor of the tray comprises detecting a circuit formed by first and second contact electrodes attached to the bottom of the piezoelectric flex element.

* * * * *